(12) United States Patent
Fujiwara et al.

(10) Patent No.: US 11,750,112 B2
(45) Date of Patent: Sep. 5, 2023

(54) INVERTER DEVICE INCLUDING A BOOTSTRAP CIRCUIT

(71) Applicant: DAIKIN INDUSTRIES, LTD., Osaka (JP)

(72) Inventors: Masahide Fujiwara, Osaka (JP); Nobuyasu Hiraoka, Osaka (JP); Keito Kotera, Osaka (JP); Taku Itou, Osaka (JP); Masaki Kouno, Osaka (JP); Reiji Kawashima, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 18/090,177

(22) Filed: Dec. 28, 2022

(65) Prior Publication Data

US 2023/0145005 A1 May 11, 2023

Related U.S. Application Data

(63) Continuation of application No. PCT/JP2021/024185, filed on Jun. 25, 2021.

(30) Foreign Application Priority Data

Jun. 29, 2020 (JP) ................................. 2020-112083

(51) Int. Cl.
*H02M 7/537* (2006.01)
*H05K 1/18* (2006.01)
(Continued)

(52) U.S. Cl.
CPC ........... *H02M 7/537* (2013.01); *H02M 7/003* (2013.01); *H05K 1/181* (2013.01); *H05K 7/209* (2013.01); *H05K 2201/10015* (2013.01)

(58) Field of Classification Search
CPC ...... H02M 7/537; H02M 7/003; H05K 1/181; H05K 7/209; H05K 2201/10015
See application file for complete search history.

(56) References Cited

U.S. PATENT DOCUMENTS 6,313,598 B1  11/2001  Tamba et al.
2003/0006434 A1  1/2003  Kawafuji et al.
(Continued)

FOREIGN PATENT DOCUMENTS

JP  2000-91499 A   3/2000
JP  2003-18862 A   1/2003
(Continued)

OTHER PUBLICATIONS

International Preliminary Report on Patentability and Written Opinion of the International Searching Authority for International Application No. PCT/JP2021/024185, dated Jan. 12, 2023.
(Continued)

*Primary Examiner* — Kyle J Moody
*Assistant Examiner* — Jye-June Lee
(74) *Attorney, Agent, or Firm* — Birch, Stewart, Kolasch & Birch, LLP

(57) ABSTRACT

To achieve high density integration of components while securing an insulation distance between a bootstrap capacitor and an intelligent power module. In a printed wiring board, a region where a capacitor is mounted is located in a region where an intelligent power module is mounted. Therefore, the capacitor mounted on the printed wiring board is placed between the printed wiring board and the intelligent power module.

16 Claims, 4 Drawing Sheets

(51) Int. Cl.
*H05K 7/20* (2006.01)
*H02M 7/00* (2006.01)

(56) References Cited

U.S. PATENT DOCUMENTS

| | | |
|---|---|---|
| 2003/0016505 A1 | 1/2003 | Jauregui |
| 2007/0158778 A1 | 7/2007 | Kitabatake et al. |
| 2016/0164417 A1* | 6/2016 | Ishii ..................... H02M 3/158 |
| | | 323/271 |
| 2019/0157967 A1* | 5/2019 | Nishimura ............. H05K 7/209 |
| 2021/0028716 A1 | 1/2021 | Ando |
| 2022/0304184 A1* | 9/2022 | Rigbers ................. H05K 1/181 |

FOREIGN PATENT DOCUMENTS

| | | |
|---|---|---|
| JP | 2003-528449 A | 9/2003 |
| WO | WO 2006/022387 A1 | 3/2006 |
| WO | WO 2018/003827 A1 | 1/2018 |
| WO | WO 2019/216159 A1 | 11/2019 |

OTHER PUBLICATIONS

International Search Report (PCT/ISA/210) issued in PCT/JP2021/024185, dated Sep. 7, 2021.
Written Opinion of the International Search Authority (PCT/ISA/237) for PCT/JP2021/024185, dated Sep. 7, 2021.

* cited by examiner

INVERTER DEVICE INCLUDING A BOOTSTRAP CIRCUIT

CROSS REFERENCE TO RELATED APPLICATIONS

This application is a Continuation of PCT International Application No. PCT/JP2021/024185, filed on Jun. 25, 2021, which claims priority under 35 U.S.C. 119(a) to Patent Application No. 2020-112083, filed in Japan on Jun. 29, 2020, all of which are hereby expressly incorporated by reference into the present application.

TECHNICAL FIELD

The present disclosure relates to an inverter device including a bootstrap circuit.

BACKGROUND ART

For example, Patent Literature 1 (WO2018-003827) discloses a known inverter device for driving a three-phase motor. The inverter device includes a bootstrap capacitor that obtains operating voltage for switching elements in order to drive an upper arm-side switching element.

SUMMARY

A first aspect is directed to an inverter device including a printed wiring board, an intelligent power module, and a bootstrap capacitor. The intelligent power module is mounted on a first surface of the printed wiring board. The intelligent power module includes a package and an upper arm-side switching element and a lower arm-side switching element incorporated in the package and constituting at least an inverter circuit. The bootstrap capacitor is mounted on the first surface of the printed wiring board. The bootstrap capacitor is charged during an ON operation of the lower arm-side switching element and generates a potential higher than a low potential at the upper arm-side switching element. The bootstrap capacitor is placed between the printed wiring board and the intelligent power module.

DESCRIPTION OF EMBODIMENTS (1) Overview

Figure 1:
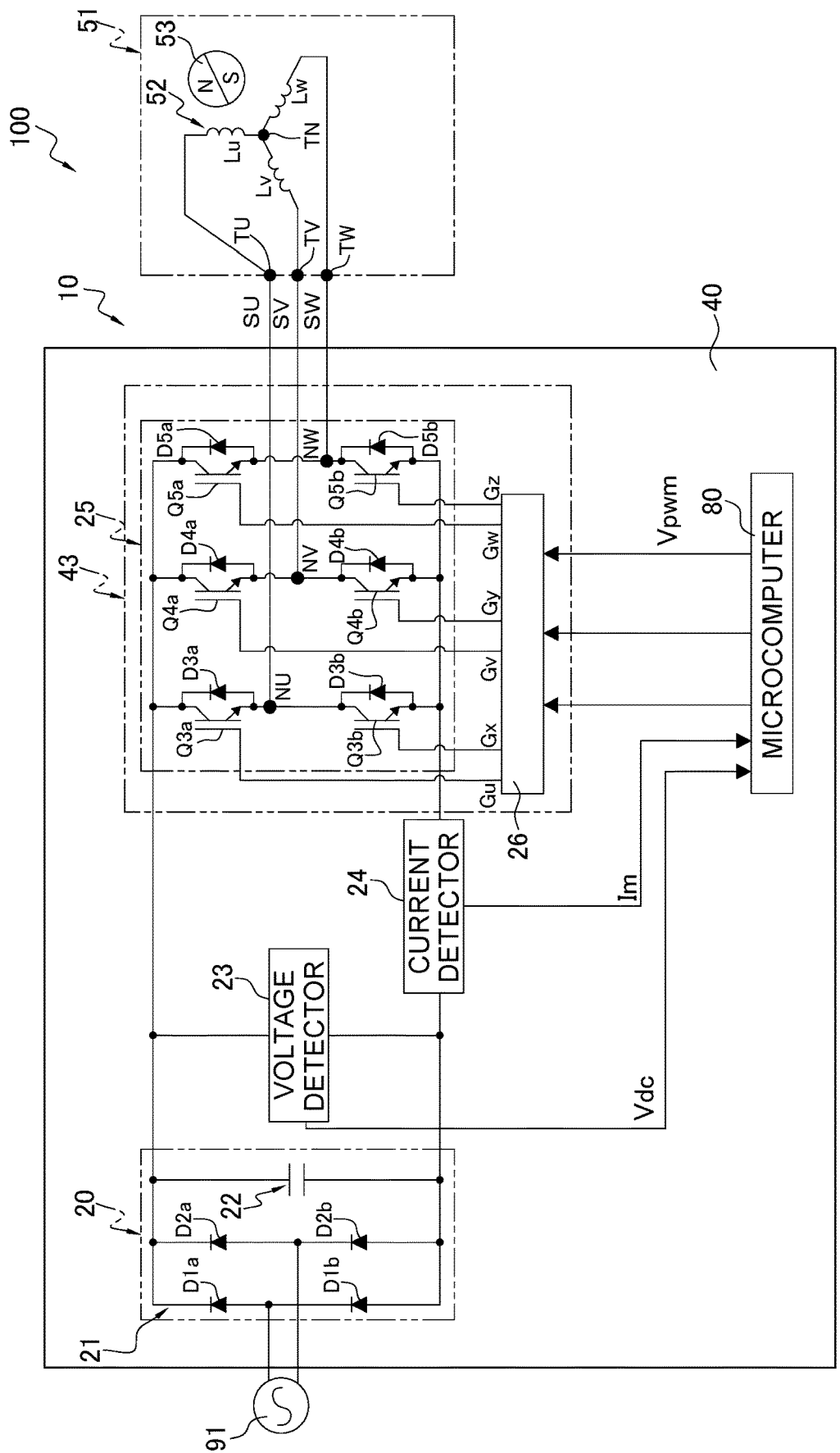
FIG. 1 is a circuit diagram illustrating connection between a three-phase motor and a motor driver including an inverter device according to an embodiment of the present disclosure.

FIG. 1 is a circuit diagram illustrating connection between a three-phase motor 51 and a motor driver 10 including an inverter device according to an embodiment of the present disclosure. As illustrated in FIG. 1, the motor driver 10 and the motor 51 constitute a system 100. The inverter device includes at least an intelligent power module 43.

(1-1) Motor 51

The motor 51 is a three-phase brushless DC motor and includes a stator 52 and a rotor 53. The stator 52 includes a U-phase drive coil Lu, a V-phase drive coil Lv, and a W-phase drive coil Lw that are star-connected. The drive coil Lu has a first end connected to a drive coil terminal TU of a U-phase wire extending from an inverter circuit 25. The drive coil Lv has a first end connected to a drive coil terminal TV of a V-phase wire extending from the inverter circuit 25. The drive coil Lw has a first end connected to a drive coil terminal TW of a W-phase wire extending from the inverter circuit 25. The drive coils Lu, Lv, and Lw have second ends connected to each other as a terminal TN. The drive coils Lu, Lv, and Lw of the three phases generate, by rotation of the rotor 53, an induced voltage according to the rotational speed and position of the rotor 53.

The rotor 53 includes a multi-polar permanent magnet including an N-pole and an S-pole, and rotates about an axis of rotation with respect to the stator 52.

The motor 51 is usable as, for example, a compressor motor and a fan motor in a heat pump-type air conditioner.

(1-2) Motor Driver 10

As illustrated in FIG. 1, the motor driver 10 includes a rectifier 21, a smoothing capacitor 22, a voltage detector 23, a current detector 24, the intelligent power module 43, and a microcomputer 80. These components are mounted on a printed wiring board 40.

(2) Specific Configuration of Motor Driver 10

(2-1) Rectifier 21

The rectifier 21 is a bridge rectifier and includes four diodes D1a, D1b, D2a, and D2b. Specifically, the diodes D1a and D1b are connected in series, and the diodes D2a and D2b are connected in series. The diodes D1a and D2a each include a cathode terminal connected to a positive-side terminal of the smoothing capacitor 22 to function as a positive-side output terminal of the rectifier 21. The diodes D1b and D2b each include an anode terminal connected to a negative-side terminal of the smoothing capacitor 22 to function as a negative-side output terminal of the rectifier 21.

A node between the diode D1a and the diode D1b is connected to a first pole of a commercial power supply 91. A node between the diode D2a and the diode D2b is connected to a second pole of the commercial power supply 91. The rectifier 21 rectifies an alternating-current voltage output from the commercial power supply 91 to generate direct-current power, and supplies the direct-current power to the smoothing capacitor 22.

(2-2) Smoothing Capacitor 22

The smoothing capacitor 22 has a first end connected to the positive-side output terminals of the rectifier 21 and a second end connected to the negative-side output terminals of the rectifier 21. The smoothing capacitor 22 smooths a voltage rectified by the rectifier 21. For convenience of the description, the voltage smoothed by the smoothing capacitor 22 is referred to as a direct-current voltage Vdc below.

The direct-current voltage Vdc is applied to the inverter circuit 25 connected to the output side of the smoothing capacitor 22. The rectifier 21 and the smoothing capacitor 22 constitute a power supply 20 for the inverter circuit 25.

Examples of the capacitor may include, but not limited to, an electrolytic capacitor, a film capacitor, and a tantalum capacitor. In this embodiment, the smoothing capacitor 22 is a film capacitor.

(2-3) Voltage Detector 23

The voltage detector 23 is connected to the output side of the smoothing capacitor 22, and is configured to detect a value of a voltage across the smoothing capacitor 22, that is, a value of the direct-current voltage Vdc. For example, the voltage detector 23 includes two resistors connected in series, and the two resistors are connected in parallel with the smoothing capacitor 22 to divide the direct-current voltage Vdc. The voltage detector 23 outputs, to the microcomputer 80, a value of a voltage at a node between the two resistors.

(2-4) Current Detector 24

The current detector 24 is located between the smoothing capacitor 22 and the inverter circuit 25, and is connected to the negative-side output terminal of the smoothing capacitor 22. After startup of the motor 51, the current detector 24 detects a motor current Im passing through the motor 51 as a sum of currents for the three phases.

The current detector 24 may be, for example, an amplifier circuit including a shunt resistor and an operational amplifier configured to amplify a voltage across the shunt resistor. The current detector 24 outputs the motor current thus detected to the microcomputer 80.

(2-5) Intelligent Power Module 43

The intelligent power module 43 is a component obtained by incorporating, in one module, the inverter circuit 25 including switching elements connected in series and a control circuit 26 having a gate control function for driving the inverter circuit 25.

(2-5-1) Inverter Circuit 25

The inverter circuit 25 includes three upper arms connected in parallel and three lower arms connected in parallel. These upper and lower arms are provided for the U, V, and W-phase drive coils Lu, Lv, and Lw of the motor 51, respectively, and are connected to the output side of the smoothing capacitor 22.

As illustrated in FIG. 1, the inverter circuit 25 includes a plurality of insulated gate bipolar transistors (IGBTs) (hereinafter, simply referred to as transistors) Q3a, Q3b, Q4a, Q4b, Q5a, and Q5b and a plurality of reflux diodes D3a, D3b, D4a, D4b, D5a, and D5b.

The transistors Q3a and Q3b are connected in series to constitute the upper and lower arms, and an output line extends from a node NU between the transistors Q3a and Q3b toward the U-phase drive coil Lu. The transistors Q4a and Q4b are connected in series to constitute the upper and lower arms, and an output line extends from a node NV between the transistors Q4a and Q4b toward the V-phase drive coil Lv. The transistors Q5a and Q5b are connected in series to constitute the upper and lower arms, and an output line extends from a node NW between the transistors Q5a and Q5b toward the W-phase drive coil Lw.

The diodes D3a to D5b are respectively connected in parallel with the transistors Q3a to Q5b with the collector terminal of each transistor connected to the cathode terminal of the corresponding diode and the emitter terminal of each transistor connected to the anode terminal of the corresponding diode. Each transistor and the corresponding diode, which are connected in parallel, constitute a switching element.

The inverter circuit 25 receives the direct-current voltage Vdc from the smoothing capacitor 22 and turns on and off the transistors Q3a to Q5b at timings instructed by the control circuit 26 to generate drive voltages SU, SV, and SW for driving the motor 51. The drive voltage SU is output to the drive coil Lu of the motor 51 via the node NU between the transistors Q3a and Q3b. The drive voltage SV is output to the drive coil Lv of the motor 51 via the node NV between the transistors Q4a and Q4b. The drive voltage SW is output to the drive coil Lw of the motor 51 via the node NW between the transistors Q5a and Q5b.

In this embodiment, the inverter circuit 25 is a voltage source inverter. The inverter circuit 25 may alternatively be a current source inverter.

(2-5-2) Control Circuit 26

The control circuit 26 switches between the ON state and the OFF state of each of the transistors Q3a to Q5b of the inverter circuit 25, based on a command voltage Vpwm from the microcomputer 80. Specifically, the control circuit 26 generates gate control voltages Gu, Gx, Gv, Gy, Gw, and Gz to be respectively applied to the gates of the transistors Q3a, Q3b, Q4a, Q4b, Q5a, and Q5b such that the inverter circuit 25 outputs, to the motor 51, pulsed drive voltages SU, SV, and SW in a duty ratio determined by the microcomputer 80. The gate control voltages Gu, Gx, Gv, Gy, Gw, and Gz thus generated are respectively applied to the gate terminals of the transistors Q3a, Q3b, Q4a, Q4b, Q5a, and Q5b.

(2-6) Microcomputer 80

The microcomputer 80 is connected to the voltage detector 23, the current detector 24, and the control circuit 26. In this embodiment, the microcomputer 80 drives the motor 51 by a rotor position sensorless method. The microcomputer 80 may alternatively drive the motor 51 by a sensor method in addition to the rotor position sensorless method.

The rotor position sensorless method refers to a method of driving the motor 51 by, for example, estimating the position and number of rotations of the rotor, performing PI control on the number of rotations, and performing PI control on the motor current, using various parameters indicating the characteristics of the motor 51, a result of detection by the voltage detector 23 after the startup of the motor 51, a result of detection by the current detector 24, a predetermined mathematical formula model regarding the control of the motor 51, and the like. Examples of the various parameters indicating the characteristics of the motor 51 may include, but not limited to, the winding resistance, inductance component, induced voltage, and number of poles of the used motor 51. It should be noted that rotor position sensorless control is described in many patent literatures; therefore, refer to these patent literatures (e.g., JP 2013-017289 A) for the details thereof.

The microcomputer 80 also performs protection control of monitoring a value detected by the voltage detector 23 and turning off the transistors Q3a to Q5b when the value detected by the voltage detector 23 exceeds a predetermined threshold value.

(2-7) Bootstrap Circuit 48

The control circuit 26 appropriately inputs a gate potential to each of the upper arm-side transistors Q3a, Q4a, and Q5a via a bootstrap circuit 48 disposed between each of the emitters of the transistors Q3a, Q4a, and Q5a and a positive electrode of a drive power supply Vb connected to a terminal Vcc.

A first bootstrap circuit 48A for a first control circuit 26A includes a first capacitor 45A, a first resistor 46A, and a first diode 47A. A second bootstrap circuit 48B for a second control circuit 26B includes a second capacitor 45B, a second resistor 46B, and a second diode 47B. A third bootstrap circuit 48C for a third control circuit 26C includes a third capacitor 45C, a third resistor 46C, and a third diode 47C.

In the following, a common description on the first bootstrap circuit 48A, the second bootstrap circuit 48B, and the third bootstrap circuit 48C will be given using an expression of bootstrap circuits 48.

Likewise, a common description on the first capacitor 45A, the second capacitor 45B, and the third capacitor 45C will be given using an expression of capacitors 45.

Likewise, a common description on the first resistor 46A, the second resistor 46B, and the third resistor 46C will be given using an expression of resistors 46.

Likewise, a common description on the first diode 47A, the second diode 47B, and the third diode 47C will be given using an expression of diodes 47.

It should be noted that the diodes 47 are omittable in a case where the intelligent power module 43 includes a diode for a bootstrap circuit.

(2-7-1) First Control Circuit 26A and First Capacitor 45A

Figure 2:
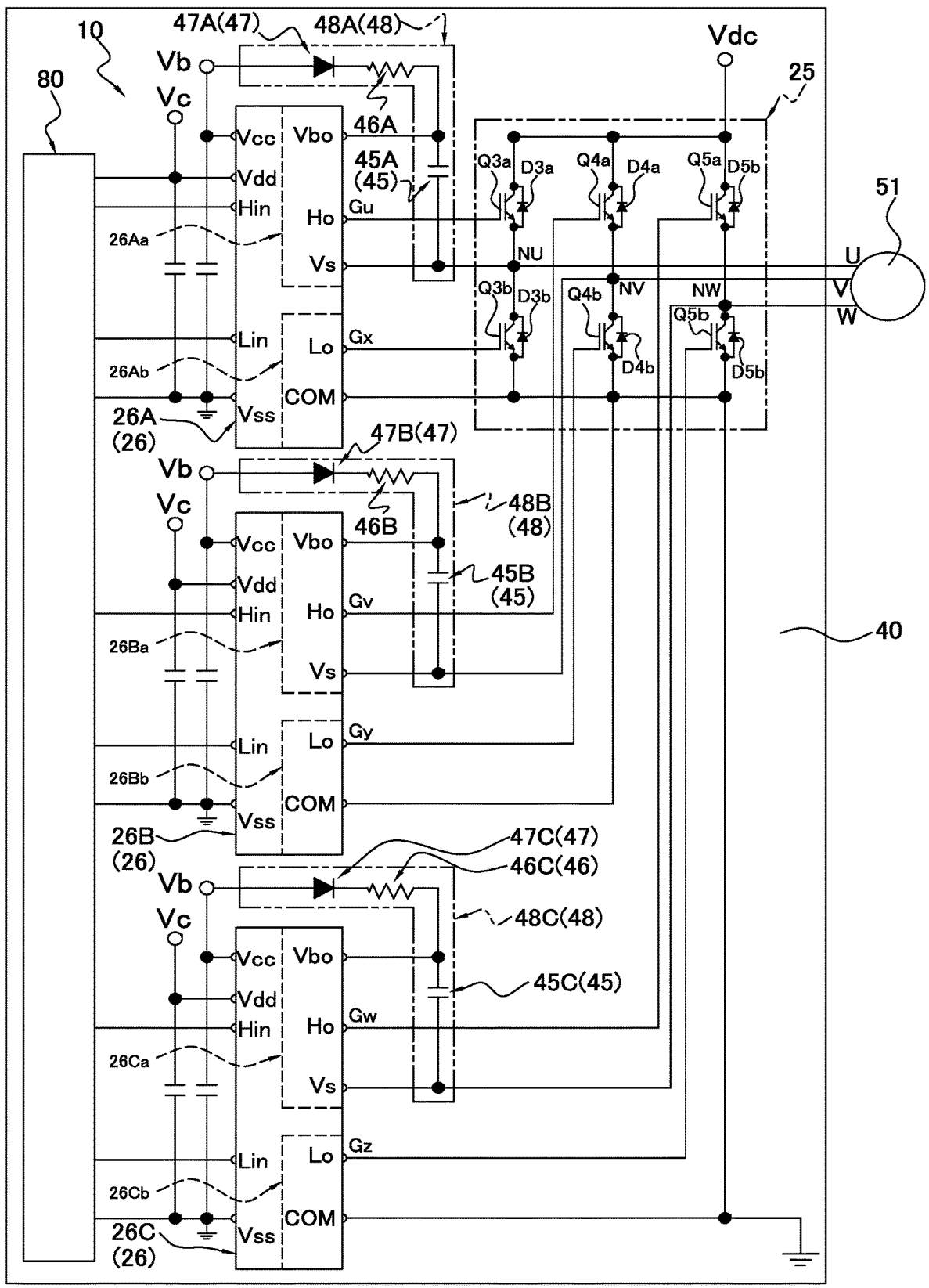
FIG. 2 is a circuit diagram illustrating the connection between the three-phase motor and the inverter device in FIG. 1.

As illustrated in FIG. 2, the first capacitor 45A has a first end connected to a node between the emitter of the upper arm-side transistor Q3a and the collector of the lower arm-side transistor Q3b. The first capacitor 45A has a second end connected to the positive electrode of the drive power supply Vb via the first resistor 46A and the first diode 47A.

The first resistor 46A is provided for restricting a charge current passing through the first capacitor 45A. The first diode 47A has a forward direction oriented from the positive electrode of the drive power supply Vb toward the first capacitor 45A so as to prevent the first capacitor 45A from being discharged via the first resistor 46A.

The first control circuit 26A includes an upper arm-side control circuit 26Aa configured to receive a high potential from the first capacitor 45A in order to control the ON/OFF state of the transistor Q3a. The first control circuit 26A also includes a lower arm-side control circuit 26Ab configured to control the ON/OFF state of the transistor Q3b. However, since the emitter of the transistor Q3b is grounded, the lower arm-side control circuit 26Ab is capable of controlling the ON/OFF state of the transistor Q3b, using a potential at the positive electrode of the drive power supply Vb connected to the terminal Vcc.

(2-7-2) Second Control Circuit 26B and Second Capacitor 45B

The second capacitor 45B has a first end connected to a node between the emitter of the upper arm-side transistor Q4a and the collector of the lower arm-side transistor Q4b. The second capacitor 45B has a second end connected to the positive electrode of the drive power supply Vb via the second resistor 46B and the second diode 47B.

The second resistor 46B is provided for restricting a charge current passing through the second capacitor 45B. The second diode 47B has a forward direction oriented from the positive electrode of the drive power supply Vb toward the second capacitor 45B so as to prevent the second capacitor 45B from being discharged via the second resistor 46B.

The second control circuit 26B includes an upper arm-side control circuit 26Ba configured to receive a high potential from the second capacitor 45B in order to control the ON/OFF state of the transistor Q4a. The second control circuit 26B also includes a lower arm-side control circuit 26Bb configured to control the ON/OFF state of the transistor Q4b. However, since the emitter of the transistor Q4b is grounded, the lower arm-side control circuit 26Bb is capable of controlling the ON/OFF state of the transistor Q4b, using a potential at the positive electrode of the drive power supply Vb connected to the terminal Vcc.

(2-7-3) Third Control Circuit 26C and Third Capacitor 45C

The third capacitor 45C has a first end connected to a node between the emitter of the upper arm-side transistor Q5a and the collector of the lower arm-side transistor Q5b. The third capacitor 45C has a second end connected to the positive electrode of the drive power supply Vb via the third resistor 46C and the third diode 47C.

The third resistor 46C is provided for restricting a charge current passing through the third capacitor 45C. The third diode 47C has a forward direction oriented from the positive electrode of the drive power supply Vb toward the third capacitor 45C so as to prevent the third capacitor 45C from being discharged via the third resistor 46C.

The third control circuit 26C includes an upper arm-side control circuit 26Ca configured to receive a high potential from the third capacitor 45C in order to control the ON/OFF state of the transistor Q5a. The third control circuit 26C also includes a lower arm-side control circuit 26Cb configured to control the ON/OFF state of the transistor Q5b. However, since the emitter of the transistor Q5b is grounded, the lower arm-side control circuit 26Cb is capable of controlling the ON/OFF state of the transistor Q5b, using a potential at the positive electrode of the drive power supply Vb connected to the terminal Vcc.

(3) Placement of Intelligent Power Module 43 and Capacitors 45

Figure 3:
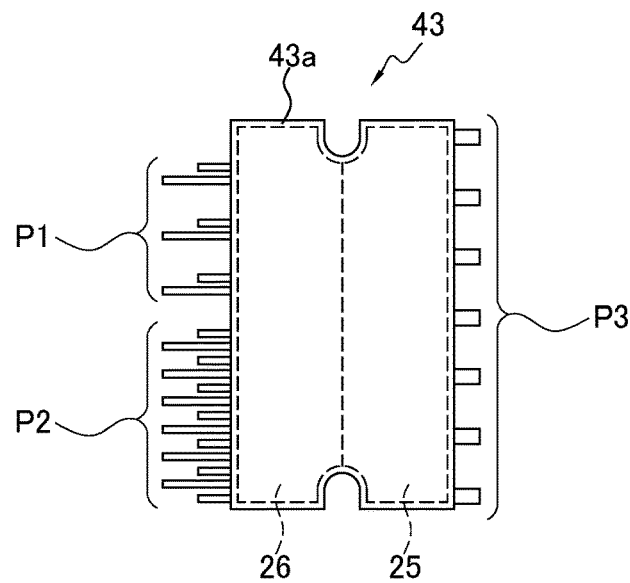
FIG. 3 is a plan view of an intelligent power module.

FIG. 3 is a plan view of the intelligent power module 43. As seen in front view of FIG. 3, a package 43a incorporates therein the control circuit 26 located on a left side thereof and the inverter circuit 25 located on a right side thereof.

A first contact pin group P1 and a second contact pin group P2 protrude from a left end of the control circuit 26. The first contact pin group P1 receives a potential at each capacitor 45. The second contact pin group P2 receives a drive voltage and a control signal.

A third contact pin group P3 protrudes from a right end of the inverter circuit 25. The third contact pin group P3 outputs power converted by the inverter circuit 25.

Figure 4:
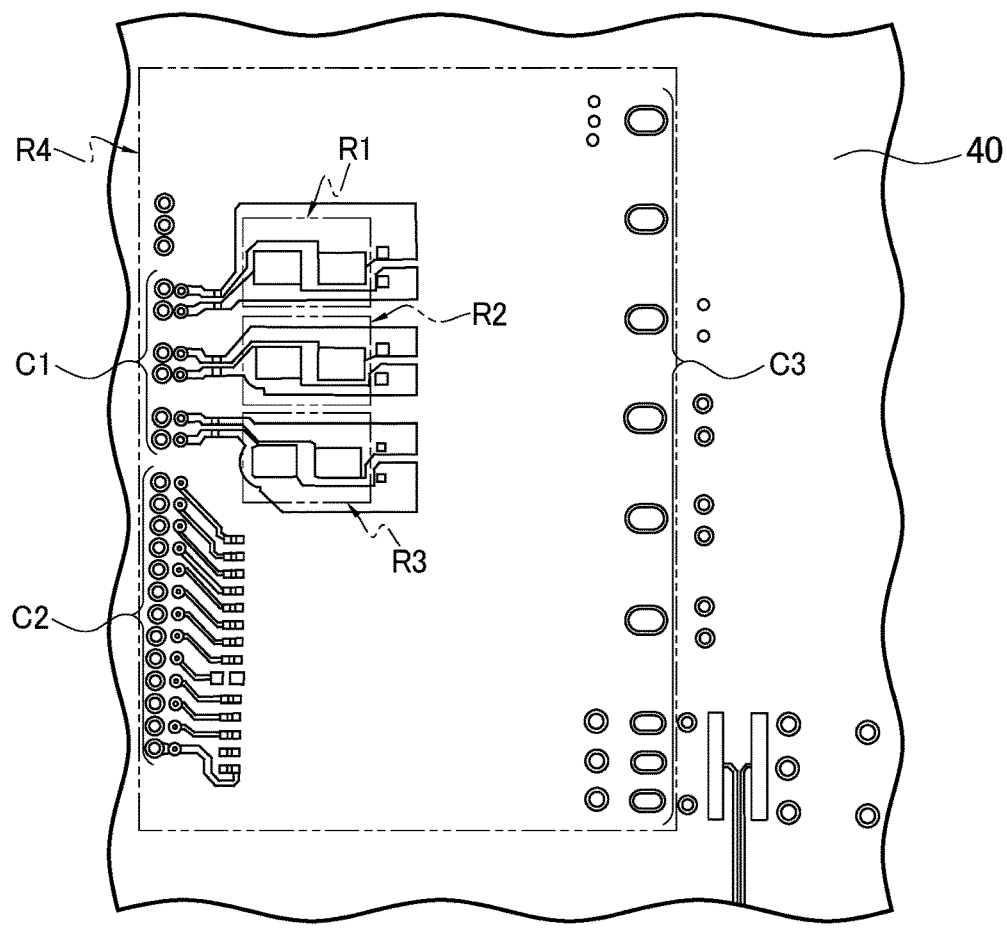
FIG. 4 is a partial plan view of a printed wiring board on which no components are mounted, and illustrates a region where a capacitor is placed and a region where the intelligent power module is placed.

FIG. 4 is a partial plan view of the printed wiring board 40 on which no components are mounted, and illustrates regions R1 to R3 where the capacitors 45 are respectively placed and a region R4 where the intelligent power module 43 is placed.

In FIG. 4, the regions R1 to R3, each of which is surrounded by a chain double-dashed line, are regions where the capacitors 45 are respectively mounted. Specifically, the first capacitor 45A is mounted on the region R1, the second capacitor 45B is mounted on the region R2, and the third capacitor 45C is mounted on the region R3.

Also in FIG. 4, the region R4, which is surrounded by a chain double-dashed line, is a region where the intelligent power module 43 is mounted. The regions R1 to R3 are located in the region R4.

The region R4 has a plurality of round hole lands located at its left end in front view. The contact pins protruding from the control circuit 26 of the intelligent power module 43 are respectively inserted in and soldered to the round hole lands.

The plurality of round hole lands include a first land group C1 provided for the first contact pin group P1 illustrated in FIG. 3. The round hole lands in the first land group C1 are respectively connected to portions, where the electrodes of the capacitors 45 are soldered, via a conductive pattern.

The plurality of round hole lands also include a second land group C2 provided for the second contact pin group P2 illustrated in FIG. 3. The second land group C2 is connected to the drive power supply Vb, the microcomputer 80, and the like via the conductive pattern.

The region R4 also has a plurality of oblong hole lands located at its right end in front view. The contact pins protruding from the inverter circuit 25 are respectively inserted in and soldered to the oblong hole lands. The plurality of oblong hole lands include a third land group C3 provided for the third contact pin group P3 illustrated in FIG. 3. The third land group C3 is connected to the motor 51 via the conductive pattern.

The regions R1 to R3 where the capacitors 45 are respectively mounted are located near the first land group C1 and are spaced away from the second land group C2 and the third land group C3 by a predetermined distance or more. In this embodiment, the predetermined distance is 3.2 mm or more in creepage distance and is 2 mm or more in spatial distance. This configuration therefore secures an insulation distance between the intelligent power module 43 and the capacitors 45 mounted on the printed wiring board 40.

Figure 5:
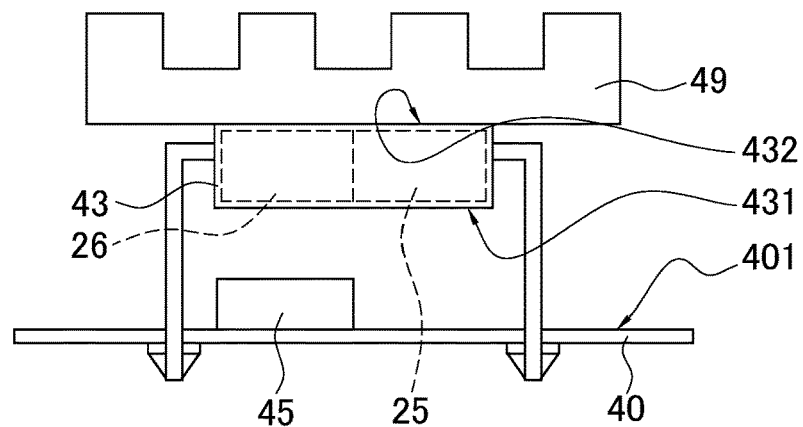
FIG. 5 is a side view of the capacitor and the intelligent power module each mounted on the printed wiring board.

FIG. 5 is a side view of the capacitors 45 and the intelligent power module 43 each mounted on the printed wiring board 40. As illustrated in FIGS. 4 and 5, since the regions R1 to R3 are located in the region R4, the capacitors 45 are mounted first, and the intelligent power module 43 is then mounted so as to be located above the capacitors 45. The capacitors 45 are therefore located between a first surface 401 of the printed wiring board 40 and a first outer surface 431 of the intelligent power module 43.

In the intelligent power module 43 illustrated in FIG. 5, the inverter circuit 25 is located on the right side in front view, and the control circuit 26 is located on the left side in front view. The inverter circuit 25 is larger in heating value than the control circuit 26. In this embodiment, therefore, the capacitors 45 are mounted so as to be located below the control circuit 26 such that the capacitors 45 are less susceptible to an influence of heat generated from the inverter circuit 25.

As illustrated in FIG. 5, a heat sink 49 is disposed on the intelligent power module 43 so as to encourage heat dissipation from the inverter circuit 25 heated to high temperatures. The intelligent power module 43 has the first outer surface 431 facing the first surface 401 of the printed wiring board 40, and a second outer surface 432 farther from the printed wiring board 40 than the first outer surface 431 is. The heat sink 49 is disposed on the second outer surface 432.

Therefore, the capacitors 45 are placed beside the first outer surface 431 and the heat sink 49 is placed beside the second outer surface 432 as seen from the first surface 401 of the printed wiring board 40.

As a result, the intelligent power module 43 and the heat sink 49 are placed beside the first surface 401 of the printed wiring board 40. This configuration thus achieves high integration of the components.

(4) Features (4-1)

In the printed wiring board 40, the regions R1 to R3 where the capacitors 45 are respectively mounted are located in the region R4 where the intelligent power module 43 is mounted. Therefore, the capacitors 45 mounted on the printed wiring board 40 are placed between the printed wiring board 40 and the intelligent power module 43.

In a case of a known printed wiring board, the capacitors 45 are mounted outside the region where the intelligent power module 43 is mounted. This configuration therefore requires not only an insulation distance between the intelligent power module 43 and each capacitor 45, but also an insulation distance between each capacitor 45 and another electric component. The use of the known printed wiring board thus leads to an increase in on-board space. Also in the known printed wiring board, there is a possibility that noise caused during operation of the transistors Q3a, Q4a, and Q5a is superimposed on the bootstrap circuits 48 to exert an adverse influence on another circuit or to cause malfunction of the intelligent power module 43.

According to this embodiment, however, at least the areas of the regions R1 to R3 where the capacitors 45 are mounted and the area of the region corresponding to the insulation distance between the intelligent power module 43 and each capacitor 45 are reduced from the on-board space of the known printed wiring board.

This configuration therefore allows the capacitors 45 and the intelligent power module 43 to be placed in the same region in plan view while securing the required insulation distance. This configuration thus achieves high density integration of the components. This configuration also eliminates the possibility that the switching noise is superimposed on the bootstrap circuits 48 to exert an adverse influence on another circuit or to cause malfunction of the intelligent power module 43.

(4-2)

The intelligent power module 43 includes the inverter circuit 25 and the control circuit 26 configured to control the inverter circuit 25. The inverter circuit 25 is larger in heating value than the control circuit 26. The capacitors 45 are placed between the printed wiring board 40 and the control circuit 26. The capacitors 45 are therefore less susceptible to a thermal influence of the inverter circuit 25.

(4-3)

The rectifier 21 is mounted on the first surface 401 of the printed wiring board 40. The rectifier 21 converts an alternating-current voltage from the commercial power supply into a direct-current voltage, and supplies the direct-current voltage to the inverter circuit 25. As a result, the intelligent power module 43 and the rectifier 21 are placed beside the first surface 401 of the printed wiring board 40. This configuration therefore achieves high density integration of the components.

(4-4)

The intelligent power module 43 has the first outer surface 431 and the second outer surface 432. The capacitors 45 are placed beside the first outer surface 431. The heat sink 49 is placed beside the second outer surface 432. As a result, the intelligent power module 43 and the heat sink 49 are placed beside the first surface 401 of the printed wiring board 40. This configuration thus achieves high integration of the components.

(4-5)

The printed wiring board 40 has the plurality of lands in and to which the contact pins of the intelligent power module 43 are inserted and soldered. The first contact pin group P1, that receives a potential at each capacitor 45 is soldered to the first land group C1. The second contact pin group P2 that receives a potential at the drive power supply Vb and a control signal from the microcomputer 80 is soldered to the second land group C2. The capacitors 45 are placed beside the first contact pin group P1 at the position away from the second contact pin group P2 by the predetermined insulation distance.

(5) Others

Figure 6A:
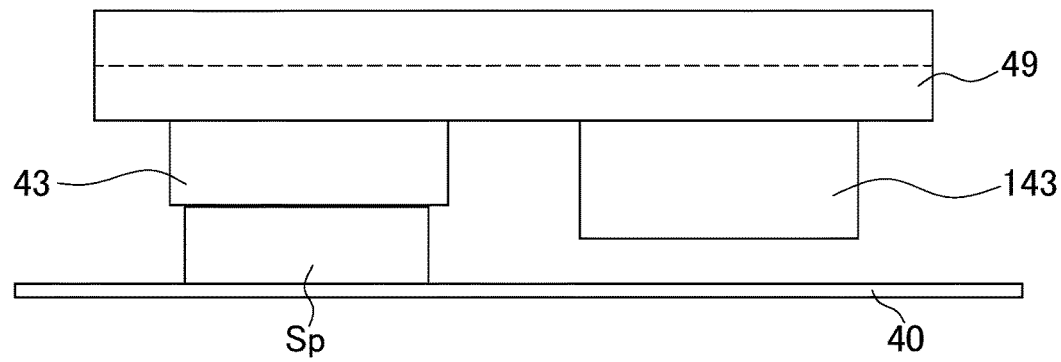
FIG. 6A is a side view of an intelligent power module and its periphery in a case where the intelligent power module and another power module adjacent thereto share one heat sink.
Figure 6B:
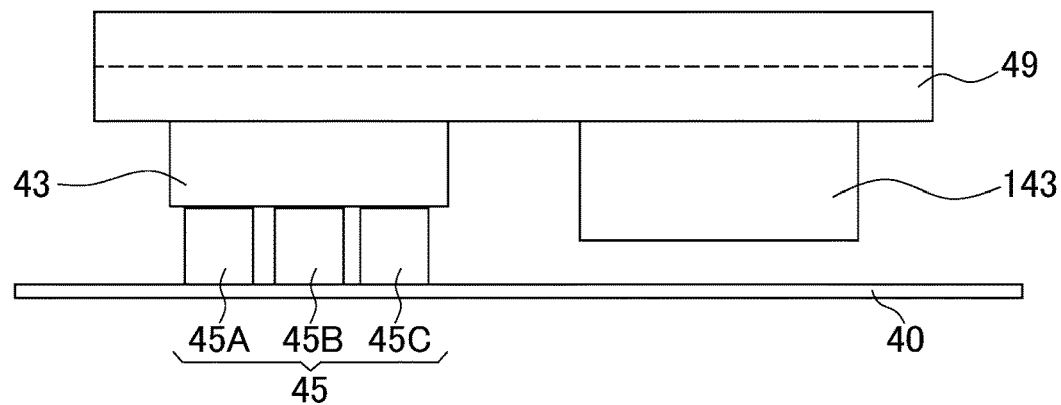
FIG. 6B is a side view of the intelligent power module and its periphery in a case where the intelligent power module and another power module adjacent thereto share one heat sink.

FIGS. 6A and 6B are side views of the intelligent power module 43 and its periphery in a case where the intelligent power module 43 and another power module 143 adjacent thereto share one heat sink 49.

As illustrated in FIG. 6A, heretofore, a resin spacer Sp has been required for aligning the height of an intelligent power module 43 with the height of another power module 143 adjacent to the intelligent power module 43.

According to this embodiment, as illustrated in FIG. 6B, each capacitor 45 placed between the printed wiring board 40 and the intelligent power module 43 serves as the resin spacer Sp. This configuration therefore eliminates the necessity of the resin spacer Sp. This configuration thus achieves reduction in number of components and high density integration of circuits.

While various embodiments of the present disclosure have been described herein above, it is to be appreciated that various changes in form and detail may be made without departing from the spirit and scope of the present disclosure presently or hereafter claimed.

EXPLANATION OF REFERENCE

21: rectifier (converter)
25: inverter circuit
26: control circuit
40: printed wiring board
43: intelligent power module
45: capacitor (bootstrap capacitor)
45A: first capacitor (bootstrap capacitor)
45B: second capacitor (bootstrap capacitor)
45C: third capacitor (bootstrap capacitor)
49: heat sink
401: first surface
431: first outer surface
432: second outer surface
P1: first contact pin group (first terminal)
P2: second contact pin group (second terminal)

CITATION LIST

Patent Literature

Patent Literature 1: WO2018-003827

The invention claimed is:

1. An inverter device comprising:
a printed wiring board;
an intelligent power module mounted on a first surface of the printed wiring board,
the intelligent power module including
a package, and
an upper arm-side switching element and a lower arm-side switching element incorporated in the package and constituting at least an inverter circuit; and
a bootstrap capacitor mounted on the first surface of the printed wiring board,
the bootstrap capacitor being configured to be charged during an ON operation of the lower arm-side switching element and generate a potential higher than a low potential at the upper arm-side switching element,
the bootstrap capacitor being placed between the printed wiring board and the intelligent power module.

2. The inverter device according to claim 1, wherein
the intelligent power module has at least two regions that are different in heating value from each other, and
the bootstrap capacitor is placed between the printed wiring board and a low heat generation region with a smaller heating value of the at least two regions.

3. The inverter device according to claim 2, wherein
the intelligent power module further includes a control circuit configured to control the inverter circuit, and
the bootstrap capacitor is placed between the printed wiring board and the control circuit of the intelligent power module.

4. The inverter device according to claim 2, further comprising:
a converter mounted on the first surface of the printed wiring board,
the converter configured to convert an alternating-current voltage from a commercial power supply into a direct-current voltage and to supply the direct-current voltage to the inverter circuit.

5. The inverter device according to claim 2, further comprising:
a heat sink configured to encourage heat dissipation from the intelligent power module,
wherein
the intelligent power module has a first outer surface and a second outer surface,
the bootstrap capacitor is placed beside the first outer surface, and
the heat sink is placed beside the second outer surface.

6. The inverter device according to claim 2, wherein
the intelligent power module includes
a first terminal to which the potential at the bootstrap capacitor is input, and
a second terminal to or from which a control signal is input or output, and
the bootstrap capacitor is placed beside the first terminal at a position away from the second terminal by a predetermined insulation distance.

7. The inverter device according to claim 1, wherein
the intelligent power module further includes a control circuit configured to control the inverter circuit, and
the bootstrap capacitor is placed between the printed wiring board and the control circuit of the intelligent power module.

8. The inverter device according to claim 7, further comprising:
a converter mounted on the first surface of the printed wiring board,
the converter configured to convert an alternating-current voltage from a commercial power supply into a direct-current voltage and to supply the direct-current voltage to the inverter circuit.

9. The inverter device according to claim 7, further comprising:
a heat sink configured to encourage heat dissipation from the intelligent power module,
wherein
the intelligent power module has a first outer surface and a second outer surface,
the bootstrap capacitor is placed beside the first outer surface, and
the heat sink is placed beside the second outer surface.

10. The inverter device according to claim 7, wherein
the intelligent power module includes
a first terminal to which the potential at the bootstrap capacitor is input, and
a second terminal to or from which a control signal is input or output, and
the bootstrap capacitor is placed beside the first terminal at a position away from the second terminal by a predetermined insulation distance.

11. The inverter device according to claim 1, further comprising:
a converter mounted on the first surface of the printed wiring board,
the converter being configured to convert an alternating-current voltage from a commercial power supply into a direct-current voltage and to supply the direct-current voltage to the inverter circuit.

12. The inverter device according to claim 11, further comprising:
a heat sink configured to encourage heat dissipation from the intelligent power module,
wherein
the intelligent power module has a first outer surface and a second outer surface,
the bootstrap capacitor is placed beside the first outer surface, and
the heat sink is placed beside the second outer surface.

13. The inverter device according to claim 11, wherein
the intelligent power module includes
a first terminal to which the potential at the bootstrap capacitor is input, and
a second terminal to or from which a control signal is input or output, and
the bootstrap capacitor is placed beside the first terminal at a position away from the second terminal by a predetermined insulation distance.

14. The inverter device according to claim 1, further comprising:
a heat sink configured to encourage heat dissipation from the intelligent power module,
wherein
the intelligent power module has a first outer surface and a second outer surface,
the bootstrap capacitor is placed beside the first outer surface, and
the heat sink is placed beside the second outer surface.

15. The inverter device according to claim 14, wherein
the intelligent power module includes
a first terminal to which the potential at the bootstrap capacitor is input, and
a second terminal to or from which a control signal is input or output, and
the bootstrap capacitor is placed beside the first terminal at a position away from the second terminal by a predetermined insulation distance.

16. The inverter device according to claim 1, wherein
the intelligent power module includes
a first terminal to which the potential at the bootstrap capacitor is input, and
a second terminal to or from which a control signal is input or output, and
the bootstrap capacitor is placed beside the first terminal at a position away from the second terminal by a predetermined insulation distance.

\* \* \* \* \*